United States Patent
Klaasen et al.

(10) Patent No.: US 6,344,679 B1
(45) Date of Patent: Feb. 5, 2002

(54) DIODE WITH ALTERABLE CONDUCTIVITY AND METHOD OF MAKING SAME

(75) Inventors: William A. Klaasen, Underhill; Wilbur D. Pricer, Charlotte; Jed Hickory Rankin, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,524

(22) Filed: Nov. 19, 1999

(51) Int. Cl.[7] .......................... G11C 17/06; H01L 27/10; H01L 29/861
(52) U.S. Cl. ................ 257/594; 257/428; 257/529; 257/530; 365/96
(58) Field of Search .................... 257/50, 428, 529, 257/530, 594, 910; 365/96

(56) References Cited

U.S. PATENT DOCUMENTS

| | | | |
|---|---|---|---|
| 4,455,495 A | * 6/1984 | Masuhara et al. | 365/96 |
| 4,881,114 A | * 11/1989 | Mohsen et al. | 257/530 |
| 5,353,246 A | * 10/1994 | Tsang et al. | 257/530 |
| 5,665,627 A | 9/1997 | Fournel et al. | 438/467 |
| 5,736,777 A | 4/1998 | Shield et al. | 257/529 |
| 5,742,555 A | 4/1998 | Marr et al. | 365/225.7 |
| 5,759,877 A | 6/1998 | Crafts et al. | 438/132 |
| 5,789,788 A | 8/1998 | Ema et al. | 257/371 |
| 5,808,351 A | 9/1998 | Nathan et al. | 257/528 |
| 5,814,876 A | 9/1998 | Peyre-Lavigne et al. | 257/529 |
| 5,821,160 A | 10/1998 | Rodriguez et al. | 438/601 |
| 5,827,759 A | 10/1998 | Froehner | 438/132 |
| 5,851,903 A | 12/1998 | Stamper | 438/467 |
| 5,973,380 A | * 10/1999 | Cutter et al. | 257/530 |
| 5,991,187 A | * 11/1999 | Cutter et al. | 365/96 |

* cited by examiner

Primary Examiner—Gene M. Munson
(74) Attorney, Agent, or Firm—Downs Rachlin & Martin PLLC

(57) ABSTRACT

A semiconductor device (102) having a plurality of diodes (100) with alterable electrical conductivity by a source of energy (30), e.g., a laser, external to the semiconductor device. The diodes are formed and energy is applied to alter the electrical conductivity at least 10%, and preferably by several orders of magnitude. Certain embodiments (20, 40 and 50) are formed so as to function as anti-fuses, while another embodiment (60) functions as a fuse. The diodes may be formed as planar diodes (20, 40, 50 and 60) or as lateral diodes (70).

27 Claims, 4 Drawing Sheets

DIODE WITH ALTERABLE CONDUCTIVITY AND METHOD OF MAKING SAME

FIELD OF THE INVENTION

The present invention relates to diodes in semiconductor devices that function as fuses or anti-fuses and, more particularly, to such diodes having an electrical conductivity that is alterable by external application of energy.

BACKGROUND OF THE INVENTION

Fuse and anti-fuse structures are used widely in semiconductor devices for logic programming, repair of defective circuits, and other purposes. Anti-fuses have an increased electrical conductivity when activated and fuses have a decreased conductivity when activated. Known fuses and anti-fuses are activated by application of laser energy, which causes a metal element to melt and/or vaporize, thereby creating an open circuit in the case of a fuse and a short circuit in the case of an anti-fuse.

Recently, copper has replaced aluminum as a wiring material for certain wiring levels in semiconductor devices. Many advanced dielectric materials used between copper wiring levels may have a porous structure with a low dielectric constant, k value, i.e., a k value of about 2. These dielectric materials cannot withstand application of laser energy at known intensities and for known periods of time used to activate a fuse or anti-fuse in an adjacent wiring level. As a result, conventional fuses and anti-fuses are not adapted for use when adjacent or underlying porous dielectric materials have a low k value.

Copper oxidation problems in semiconductor devices having copper wiring also limit the use of conventional fuses and anti-fuses of the type that are "blown" by laser energy. Unlike aluminum, copper does not self passivate. When a portion of a copper wiring line in silicon dioxide is laser deleted, a crater is created in the area where the portion of the line is deleted. This exposes the ends of the copper wiring line proximate the crater, which can result in oxidation of the line ends. Steps must be taken to prevent such oxidation from affecting other circuits in the semiconductor device, which often adds to the cost and complexity of the semiconductor fabrication process. In addition, because more energy is required to "blow" a copper fuse than an aluminum fuse, there is an increased risk of heating the substrate adjacent the fuse to the point where cracks are formed in the oxide over the substrate. When these cracks intersect copper wires, oxidation of the wires can result. Eventually, such oxidation can result in a break occurring in the copper wire, resulting in a reliability fail.

SUMMARY OF THE INVENTION

One aspect of the invention is a diode in a semiconductor device that is made in accordance with a process beginning with the step of providing a diode having a p region and an n region. The regions are positioned to form a pn junction with a first electrical conductivity. Next, energy is applied to the diode from a source external to the semiconductor device at an intensity and for a period of time sufficient to cause the electrical conductivity to change to a second electrical conductivity differing by at least 10% from the first electrical conductivity.

A second aspect of the present invention is a method of altering the electrical conductivity of a diode in a semiconductor device. The method comprises the steps of providing a diode having a p region and an n region. The regions are positioned to form a pn junction with a first electrical conductivity. Then, energy is applied to the diode from a source external to the semiconductor device at an intensity and for a period of time sufficient to cause the first electrical conductivity to change to a second electrical conductivity differing by at least 10% from the first electrical conductivity.

These and other aspects of the present invention are described in more detail below and are further defined in the appended claims.

DETAILED DESCRIPTION OF THE INVENTION

Figure 1A:
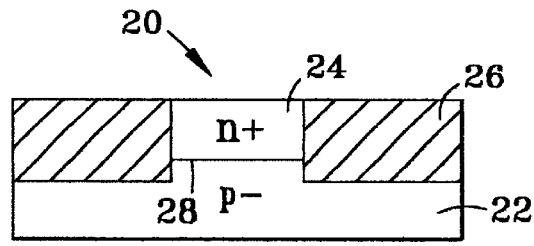
FIG. 1a is a cross-sectional view of one embodiment of the diode of the present invention before activation.
Figure 6:
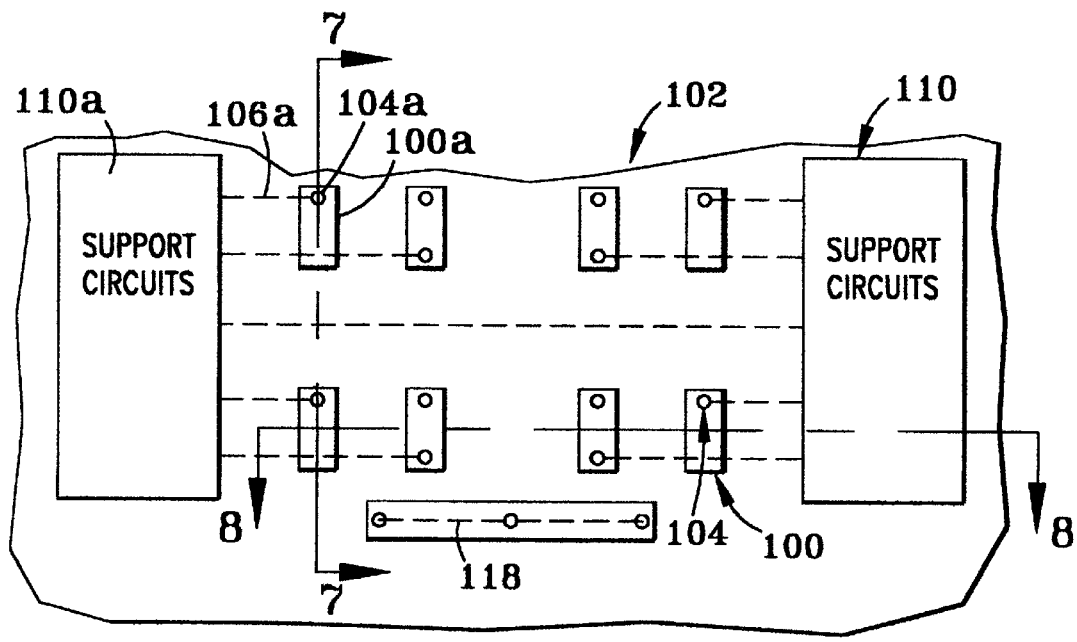
FIG. 6 is a portion of a semiconductor device incorporating several of the diodes of the present invention.

With reference to FIGS. 1a and 6, the present invention is a diode 20, and a method of making same, that, depending upon its design, functions as a fuse or an anti-fuse. The present invention is also a semiconductor device 102 having a plurality of diodes 100.

Diode 20 has a p region 22 made of p conductivity type semiconductor material such as silicon, an n region 24 made of n conductivity type silicon and oxide regions 26 adjacent the n region. The p region 22 and n region 24 are relatively positioned to form a pn junction 28. While n region 24 is illustrated as diffused in p region 22, diode 20 encompasses the reverse configuration, i.e., wherein p region 22 is diffused in n region 24.

Regions 22 and 24 are doped with conventional silicon dopants in a concentration ranging from 1E15 to 2E20 atoms/cm$^3$, with the preferred dopant concentration for the more lightly doped side of pn junction 28 being about 1E17 atoms/cm$^3$ and the more heavily doped side of the pn junction being about 1E20 atoms/cm$^3$. Lower doping concentrations will increase the resistance, making a "blown" diode 20 more difficult to read. Higher doping concentrations will result in leaky diodes structures, making it more difficult to identify "unblown" diodes. The preferred dopant concentrations are compatible with current CMOS fabrication processes, eliminating any requirement for additional process steps.

The pn junction 28 preferably has a depth of 0.1 to 1.0 microns, with a preferred depth of about 0.15 microns. Diode 20, along with other embodiments of the diode of the present invention discussed below, is, prior to application of energy 30 (discussed below), made using conventional semiconductor processing techniques of the type well known to those skilled in the art.

Diode 20 has an electrical conductivity, i.e., a leakage current across pn junction 28, that is increased by application of thermal energy from a source external to the semiconductor device in which the diode is formed. As described below, with another embodiment of the diode of the present invention, this electrical conductivity decreases. Thus, depending upon embodiment, the diode of the present invention may function as a fuse, where its electrical conductivity is decreased, or as an anti-fuse, where its electrical conductivity is increased. The change in electrical conductivity is at least 10%, and is typically several orders of magnitude, as discussed below.

Figure 1B:
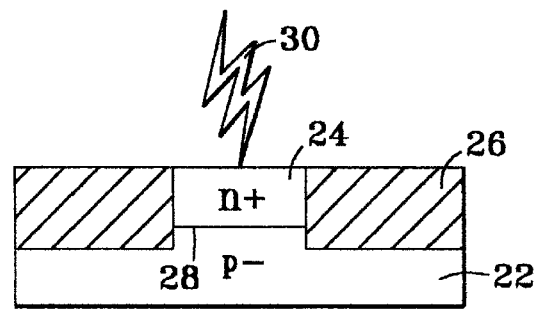
FIG. 1b is a cross-sectional view of the embodiment of FIG. 1a, with application of laser energy being illustrated.

Referring now to FIGS. 1a and 1b, electrical conductivity of diode 20 is altered by application of energy 30 from a source external to the diode and the semiconductor device (not shown) in which it is located. Preferably energy 30 is electromagnetic energy delivered in the form of a laser beam, although the present invention is not so limited. While a diode pumped laser has been satisfactorily employed in connection with practice of the present invention, other types of laser may also be used. As described below, electromagnetic energy 30 becomes thermal energy as it is absorbed by diode 20.

When a laser beam is used as energy 30, it preferably has an energy range of 0.1 to 3.0 microJoules, as determined at the spot formed by the laser beam. Except as specifically otherwise stated, laser beam energy levels referenced herein are determined at the laser spot. The energy level needed varies, in part, as a function of the doping concentration of n region 24. In one experiment where n region 24 had a doping concentration of $3E17$ atoms/cm$^3$, energy in the range of 2.4–3.0 microJoules was required to sufficiently damage pn junction 28 to increase its electrical conductivity at least 10%. Energy greater than 3.0 microJoules was found to cause cracks in diode 20. With a preferred doping concentration in n region 24 of $1E20$ atoms/cm$^3$, the required energy level will likely be lowered to the range of about 0.2 to 2.0 microJoules. Lower energy ranges may be desirable, although 0.1 microJoules is about the current lower limit of conventional laser beam systems.

The laser beam should be controlled to form as small a spot as possible to maximize density of arrays of diodes such as diode 20. With conventional tooling, a laser beam spot with a width in the 0.5 to 5 micron range represents a good balance of what is technically achievable and yet allows reasonable density of diodes 20 to be achieved.

The wavelength of the laser beam used as energy 30 preferably ranges from 300 to 2000 nanometers, with wavelengths in the range of 800 to 1400 nanometers being preferred. Higher wavelengths typically require larger spot sizes, reducing the density of diodes 20 that can be formed in a semiconductor device.

The laser beam is preferably pulsed. Pulse widths in the range of 5 to 20 nanoseconds are satisfactory for current tooling. However, the present invention encompasses narrower and wider pulse widths, with the objective being to deliver sufficient energy in the minimum amount of time possible. The number of pulses required will vary with pulse width and energy levels. However, 5–10 pulses using pulse widths and energy levels described herein is generally satisfactory.

A fair degree of latitude exists in selection of the various parameters for application of energy 30 in the form of a laser beam. However, the objective in selecting the various parameters should be to damage pn junction 28 sufficiently to increase its electrical conductivity, i.e., increase it leakage, by at least 10%. Preferably, a greater increase in electrical conductivity, preferably, several orders of magnitude, is achieved to make it easier to identify which diodes 20 have been "blown," i.e., made more electrically conductive by application of thermal energy 30, and which have not. At the same time, the amount of energy applied should not be so great that diode 20, and adjacent regions of a semiconductor device in which diode 20 is located, are damaged. It is believed that the abrupt heating and cooling action of the laser beam creates crystalline defects or dislocations which render pn junction 28 leaky.

Current laser fuse blow tooling, e.g., the tool made by General Scanning, Inc. and identified by model number 325, having a wavelength of 1047 nanometers, may be satisfactorily employed to practice the present invention.

Figure 2A:
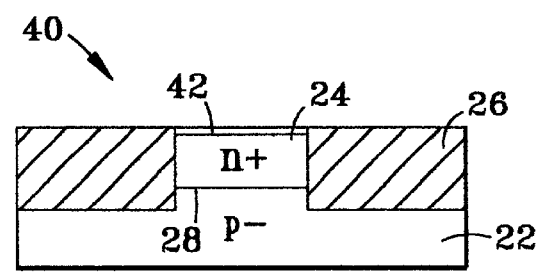
FIG. 2a is a cross-sectional view of a second embodiment of the diode of the present invention before activation.
Figure 2B:
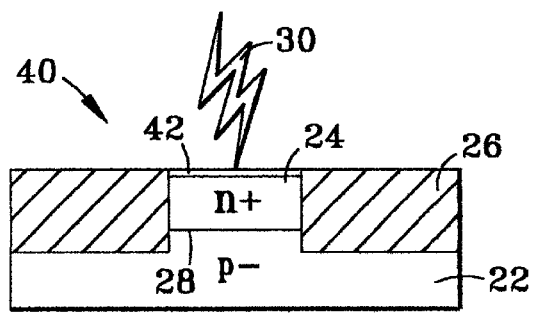
FIG. 2b is a cross-sectional view of the embodiment of FIG. 2a, with application of laser energy being illustrated.

Referring next to FIGS. 2a and 2b, diode 40 is a second embodiment of the present invention. Diode 40 is identical to diode 20, except: that it additionally includes a silicide layer 42 on top of n region 24. In selecting the depth of pn junction 28, the latter should be deep enough to prevent silicide layer 42 from making the junction leaky before application of energy 30, yet thin enough to permit the pn junction to be damaged sufficiently by energy 30 that its electrical conductivity is increased without cracking the pn junction and adjacent structure. A preferred thickness for silicide layer 42 is 0.1 to 1.0 microns, with about 0.15 microns being consistent with convention semiconductor fabrication processes.

As with diode 20, energy 30 is preferably applied to diode 40 in the form of a laser beam in the manner described above, with one exception. Laser beam energy is preferably in the range 0.1 to 2.0 microJoules, with about 0.2 microJoules being preferred.

With diode 40 it is thought that the electrical conductivity of pn junction 28 is increased, in part, by a change in state of silicide layer 42 occasioned by application of energy 30. More particularly, it is believed that application of energy 30 to silicide layer 42 causes it to agglomerate. Particles of silicide arising from this agglomeration are thought to penetrate n region 24 making pn junction 28 leaky. Also, application of energy 30 to silicide layer 42 may cause localized mechanical failure at pn junction 28. In any event, selection of the optimal values for the various parameters discussed above should be made so that the electrical conductivity of diode 40 increases at least 10%, and preferably by several orders of magnitude.

Figure 3A:
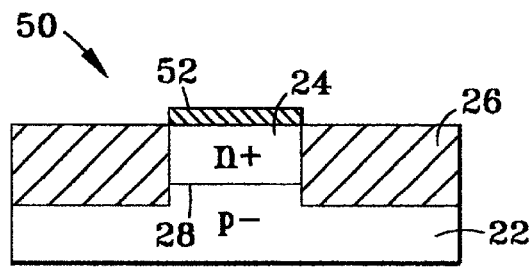
FIG. 3a is a cross-sectional view of a third embodiment of the diode of the present invention before activation.
Figure 3B:
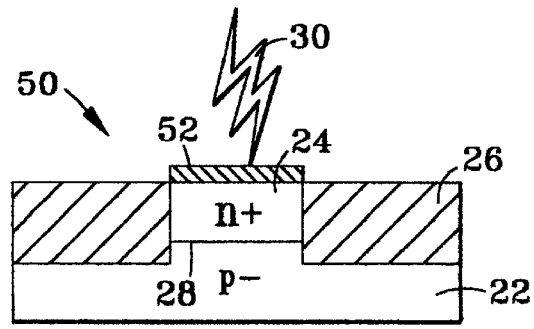
FIG. 3b is a cross-sectional view of the embodiment of FIG. 3a, with application of laser energy being illustrated.

Turning next to FIGS. 3a and 3b, diode 50 is a third embodiment of the present invention. Diode 50 is identical to diode 20, except that it includes a metal region 52 positioned to contact n region 24. Metal region 52 is preferably formed of aluminum or copper, although other materials may also be satisfactorily employed. While metal region 52 is illustrated as covering all of n region 24, in some cases it is sufficient to provide n region 24 so that it covers only part of the n region. Metal region 52 typically has a thickness in the range of 0.05 to 0.5 microns. Metal region 52 is typically not connected to the wiring of the semiconductor device in which diode 50 is located, although in some cases such connection may be desirable.

Energy 30 is preferably applied to diode 50 in the form of a laser beam in accordance with the process described above. While ideally the laser beam will contact diode 50, alteration in electrical conductivity in excess of 10% is typically achieved when the laser beam is generally directed in the area of n region 24. It is believed application of energy 30 to metal region 52 and/or adjacent portions of diode 50 causes metal to enter n region 24, causing crystal defects in the silicon of the n region in the process. These defects cause leakage in pn junction 28, thereby rendering diode 50 more electrically conductive.

Diodes 20, 40 and 50 all function as anti-fuses in that their conductivity increases with application of energy 30.

Figure 4A:
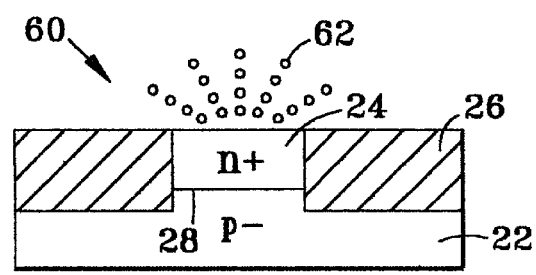
FIG. 4a is a cross-sectional view of a fourth embodiment of the diode of the present invention, with implantation of a crystal structure damaging material being illustrated.
Figure 4B:
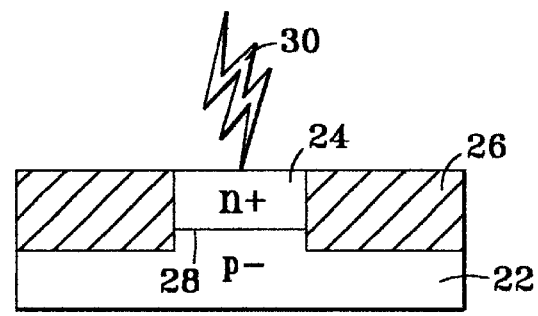
FIG. 4b is a cross-sectional view of the embodiment of FIG. 4a, with application of laser energy being illustrated.

Referring now to FIGS. 4a and 4b, diode 60 is a fourth embodiment of the present invention. Initially, diode 60 is identical to diode 20. However, before application of energy 30, and typically in connection with the initial fabrication of the diode, a material 62, such as an inert gas like Neon or Xenon or a Group IVA material from the Periodic Table such as germanium or carbon, is implanted in diode 60 so as to make pn junction 28 leaky by creating crystalline damage in the diode. Processes for implanting inert gases or Group IV materials in silicon are well known in the art. Concentrations of such implanted materials are preferably in the range of 5E14 to 10E18 ions/cm$^2$, with the precise concentration varying with the material that is implanted and the energy level of energy 30 applied to diode 60, as described below. Those skilled in the art can readily determine optimum parameters for these characteristics through routine experimentation.

When it is desired to decrease the electrical conductivity of diode 60, the damage is locally annealed out by exposing the diode to energy 30, as described above relative to diode 20, with one exception. Preferably, energy 30 is in the range 150–250 milliJoules/cm$^2$, with about 200 milliJoules/cm$^2$ being preferred. When material 62 is an inert gas, application of energy 30 causes dislocations originally created by the inert gas to be annealed and the residual gas to be released, thereby permitting diode 60 to assume its original ordered crystal pattern. In the case of Group IVA materials, application of thermal energy 30 causes defects in the crystal pattern caused by the process of implanting such materials to be annealed out. This causes a decrease in electrical conductivity of pn junction 28 of at least 10%, and preferably several orders of magnitude.

Figure 5A:
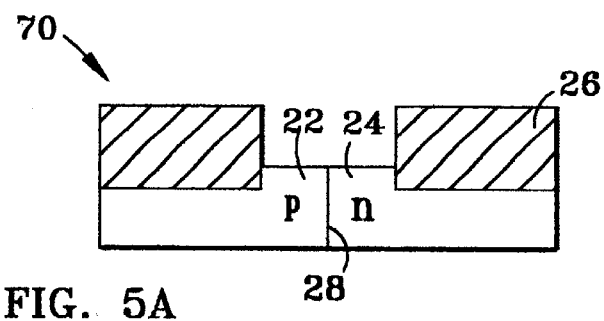
FIG. 5a is a cross-sectional view of a fifth embodiment of the diode of the present invention before activation.
Figure 5B:
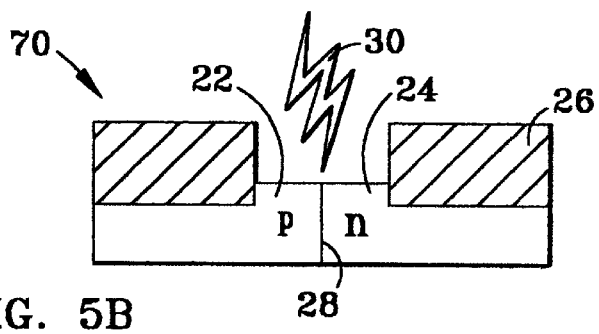
FIG. 5b is a cross-sectional view of the embodiment of FIG. 5a, with application of laser energy being illustrated.

Diodes 20, 40, 50 and 60 are illustrated as planar diodes, e.g., diodes made with a shallow trench isolation process. However, these diodes may alternatively be formed as lateral diodes. Referring to FIGS. 5a and 5b, diode 70 is a fifth embodiment of the present invention. With diode 70, p region 22 and n region 24 are positioned next to one another so that pn junction 28 runs vertically (from the perspective of FIG. 5a) between the regions, with oxide regions 26 surrounding the pn junction. Diode 70 has application in a silicon-on-insulator process, as well as in other processes.

Application of energy 30 to alter the electrical conductivity of diode 70 proceeds as discussed above relative to diode 20. Here too, process parameters are adjusted to provide a change in electrical conductivity of diode 70 of at least 10%, and preferably several orders of magnitude.

Diode 70 may also be modified to include a silicide layer analogous to layer 42 of diode 40 or a metal region analogous to metal region 52 of diode 50. In addition, a fuse version of diode 70 may be formed in the manner described above relative to diode 60.

Figure 7:
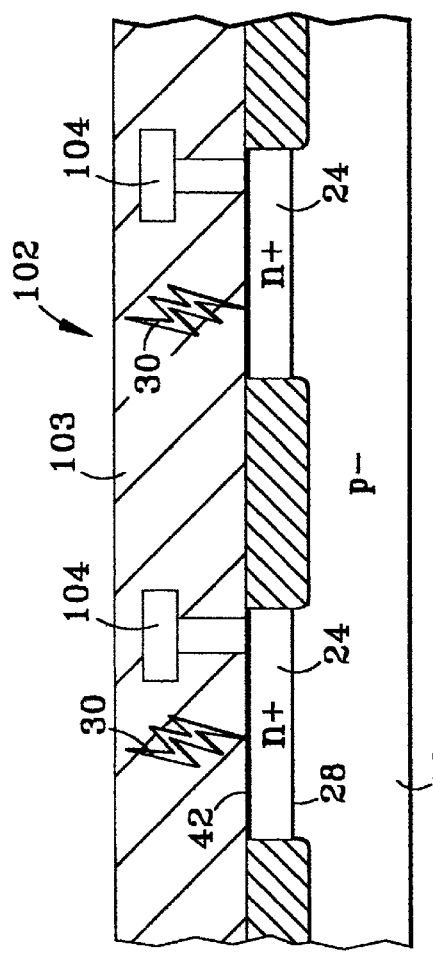
FIG. 7 is a cross-sectional view of the device in FIG. 6, taken along line 7—7 in FIG. 6, with application of laser energy being illustrated.
Figure 8:
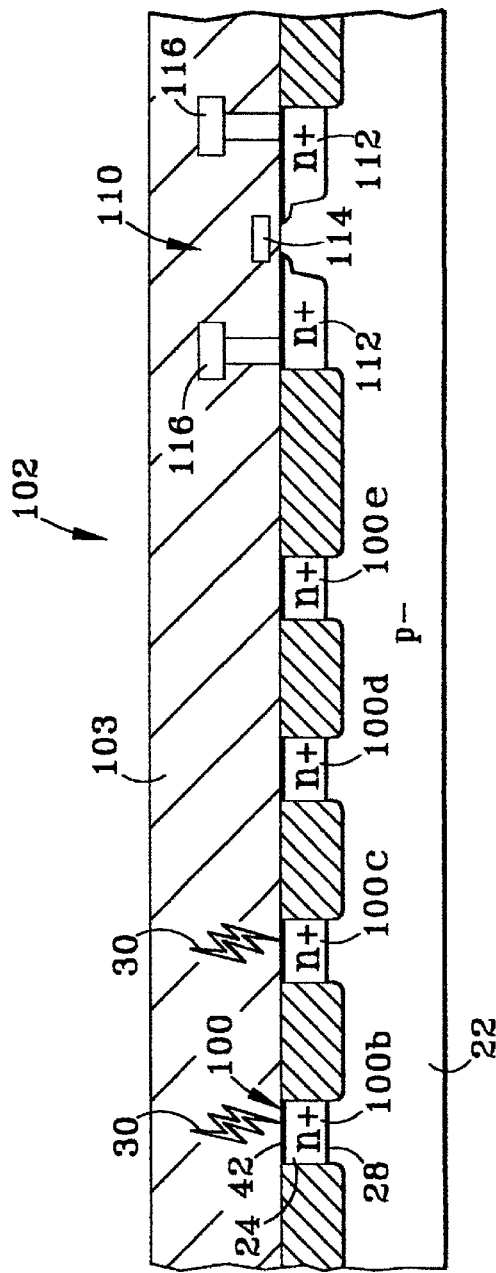
FIG. 8 is a cross-sectional view of the device of FIG. 6, taken along line 8—8 in FIG. 6, with application of laser energy being illustrated.

Referring now to FIGS. 6–8, the diodes of the present invention, referred to generically in these figures as diodes 100, are intended for use in a semiconductor device 102, only a portion of which is illustrated. While the diodes 40 of FIGS. 2a and 2b are shown in FIGS. 6 and 7, it is to be appreciated that diodes 100 represent all embodiments of the diodes of the present invention. Each diode 100 has n+ region 24 formed in a bulk p– region 22 so as to form a pn junction 28. Alternatively, semiconductor device 102 may include a bulk region made from n– silicon, with p+ silicon being diffused therein, the reverse of what is illustrated in FIGS. 6–8. Oxide regions 26 are positioned adjacent n+ region 24. Semiconductor device 102 also includes oxide layer 103 on top of diodes 100. Each diode 100 has a contact 104 via which the diode is connected to wiring 106 of semiconductor device 102.

Semiconductor device 102 also includes a plurality of support circuits 110 which are used to sense a change in signal, i.e., when a signal goes high or low. Support circuits 110 are connected via wiring 106 to diodes 100. For example, support circuit 110a is connected to diode 100a via wiring 106a which is connected to contact 104a. Support circuits 110 are conventional FETs having n+ regions or p+ regions 112 (FIG. 8), a polysilicon gate 114, and contacts 116. In addition, semiconductor device 102 includes a bulk region contact 118 (FIG. 6) that connects bulk p– region 22 with ground.

In operation, changing the electrical conductivity of diodes 100 in the manner described above with respect to diodes 20, 40, 50, 60 and 70 results in a change in current carried on wiring 106 connected to a given diode. This causes support circuit 110 to provide a high or low signal, depending upon wiring connections and type of diode used, which in turn is used with downstream logic or circuitry. Typically some, but not all, of diodes 100 are exposed to thermal energy. For example, as illustrated in FIG. 8, diodes 100b and 100c are exposed to energy 30 and diodes 100d and 100e are not exposed to energy 30.

In a working example of the present invention, diodes 40 were fabricated with a n+ region 24 dopant concentration of 1E20 atoms/cm$^3$, and p– region 22 dopant concentration of 1E17 atoms/cm$^3$, with a pn junction 28 depth of 0.15 microns. Diodes 40 were measured to have a reverse bias leakage current of less than 50 nanoamps when tested at 1.5v prior to exposure to energy 30. Measurements after exposure to energy 30, performed at 4.0 micron spot size, 0.1 uJ, and single 9nS pulse, revealed a reverse bias leakage current of greater than one milliamp. This is a change in conductivity of more than 5 orders of magnitude.

It should be appreciated that the embodiments described herein are merely exemplary and that persons skilled in the art may make variations and modifications without departing from the spirit and scope of the present invention.

What is claimed is:

1. A diode in a semiconductor device, the diode having an altered electrical conductivity and made in accordance with a process comprising the steps of:
   a. providing a diode having a p region and an n region, said regions positioned to form a pn junction with a first electrical conductivity; and
   b. applying energy to said diode from a source external to the semiconductor device at an intensity and for a period of time sufficient to cause said first electrical conductivity to change to a second electrical conductivity differing by at least 10% from said first electrical conductivity.

2. A diode according to claim 1, wherein said step b is performed so that said first electrical conductivity differs by more than an order of magnitude from said second electrical conductivity.

3. A diode according to claim 1, wherein said step b is performed so that said first electrical conductivity differs by more than 4 orders of magnitude of conductivity from said second electrical conductivity.

4. A diode according to claim 1, wherein one of said p region and n region includes a silicide layer and said step b is performed by applying said energy so as to heat said silicide layer.

5. A diode according to claim 4, wherein said silicide layer has a thickness ranging from 5 to 100 nanometers.

6. A diode according to claim 1, wherein said diode includes a metal region proximate one of said p region and n region and said step b is performed by applying said energy so as to heat said metal region.

7. A diode according to claim 1, further wherein between said step a and said step b said diode is exposed to an inert gas having sufficient energy to become implanted within at least one of said p region and said n region.

8. A diode according to claim 1, further wherein between said step a and said step b said diode is exposed to a Group IVA material having sufficient energy to become implanted within at least one of said p region and said n region.

9. A diode according to claim 1, wherein said step b is performed so that said second electrical conductivity is less than said first electrical conductivity.

10. A diode according to claim 1, wherein said step b is performed so that said second electrical conductivity is greater than said first electrical conductivity.

11. A diode according to claim 1, wherein said energy ranges from 0.1 to 3.0 microJoules.

12. A diode according to claim 11, wherein said energy is about 0.2 to 0.8 microJoules.

13. A diode according to claim 1, wherein said energy is a laser beam.

14. A diode according to claim 13, wherein said laser beam has a wavelength ranging from 300 to 2000 nanometers.

15. A diode according to claim 1, wherein said energy is applied in said step b as a pulse having a duration ranging from 5 to 20 nanoseconds.

16. A diode according to claim 1, wherein said energy is applied in said step b as a spot having a width ranging from 0.5 to 5 microns.

17. A method of altering the electrical conductivity of a diode in a semiconductor device, the method comprising the steps of:
   a. providing a diode having a p region and an n region, said regions positioned to form a pn junction with a first electrical conductivity; and
   b. applying energy to said diode from a source external to the semiconductor device at an intensity and for a period of time sufficient to cause said first electrical conductivity to change to a second electrical conductivity differing by at least 10% from said first electrical conductivity.

18. A method according to claim 17, wherein said step b is performed so that said first electrical conductivity differs by more than an order of magnitude from said second electrical conductivity.

19. A method according to claim 17, wherein one of said p region and n region includes a silicide layer and step b is performed by applying said energy so as to heat said silicide layer.

20. A method according to claim 17, wherein said diode includes a metal region proximate one of said p region and n region and said step b is performed by applying said energy so as to heat said metal region.

21. A method according to claim 17, further wherein between said step a and said step b said diode is exposed to an inert gas having sufficient energy to become implanted within at least one of said p region and said n region.

22. A method according to claim 21, wherein said step b is performed so that said second electrical conductivity is less than said first electrical conductivity.

23. A method according to claim 17, wherein said energy ranges from 0.1 to 3.0 microJoules.

24. A method according to claim 17, wherein said energy is a laser beam.

25. A method according to claim 17, wherein said energy is applied in said step b as a pulse having a duration ranging from 5 to 20 nanoseconds.

26. A semiconductor device having a first plurality of diodes and a second plurality of diodes, said first plurality of diodes having an electrical conductivity unaltered by a source external to the semiconductor device, said second plurality of diodes having an electrical conductivity altered by a source external to the semiconductor device, wherein each of said second plurality of diodes is made in accordance with the process comprising the steps of:
   a. providing a diode having a p region and an n region, said regions positioned to form a pn junction with a first electrical conductivity; and
   b. applying energy to said diode from a source external to the semiconductor device at an intensity and for a period of time sufficient to cause said first electrical conductivity to change to a second electrical conductivity differing by at least 10% from said first electrical conductivity.

27. A method of making a semiconductor device comprising the steps of:
   a. providing a plurality of first diodes;
   b. providing a plurality of second diodes, each having a p region and an n region, said regions positioned to form a pn junction with a first electrical conductivity; and
   c. applying energy to said plurality of second diodes from a source external to the semiconductor device at an intensity and for a period of time sufficient to cause said first electrical conductivity to change to a second electrical conductivity differing by at least 10% from said first electrical conductivity.

* * * * *